(12) United States Patent
Jewett et al.

(10) Patent No.: US 6,696,662 B2
(45) Date of Patent: Feb. 24, 2004

(54) METHODS AND APPARATUS FOR PLASMA PROCESSING

(75) Inventors: Russell F. Jewett, Charlotte, NC (US); Jason F. Elston, Matthews, NC (US)

(73) Assignee: Advanced Energy Industries, Inc., Fort Collins, CO (US)

(*) Notice: Subject to any disclaimer, the term of this patent is extended or adjusted under 35 U.S.C. 154(b) by 341 days.

(21) Appl. No.: 09/866,571

(22) Filed: May 25, 2001

(65) Prior Publication Data

US 2002/0020691 A1 Feb. 21, 2002

Related U.S. Application Data

(60) Provisional application No. 60/208,009, filed on May 25, 2000.

(51) Int. Cl.$^7$ ............................................. B23K 10/00
(52) U.S. Cl. .................... 219/121.48; 219/121.43; 219/121.51; 219/121.41; 118/723 MW; 156/345.36; 204/298.38
(58) Field of Search .................. 219/121.51, 121.4, 219/121.41, 121.43, 121.48, 121.38, 690, 696; 118/723 R, 723 MW, 723 I; 204/298.38, 298.37; 156/345.36, 345.41, DIG. 68; 315/111.21

(56) References Cited

U.S. PATENT DOCUMENTS

| | | | |
|---|---|---|---|
| 4,175,235 A | 11/1979 | Niwa et al. .................. 250/542 |
| 4,463,239 A | * 7/1984 | Miller .................... 219/10.55 F |
| 5,051,557 A | 9/1991 | Satzger ................... 219/121.52 |
| 5,083,004 A | 1/1992 | Wells et al. .............. 219/121.5 |
| 5,137,701 A | 8/1992 | Mundt .......................... 423/210 |
| 5,292,371 A | * 3/1994 | Yasui et al. .......... 118/723 MW |
| 5,300,202 A | 4/1994 | Moegel .................... 204/157.3 |
| 5,349,154 A | 9/1994 | Harker et al. ................ 117/102 |
| 5,453,125 A | 9/1995 | Krogh ................. 118/723 MR |
| 5,565,118 A | * 10/1996 | Asquith et al. ......... 219/121.57 |
| 5,750,823 A | 5/1998 | Wofford et al. ............. 588/210 |
| 5,793,013 A | 8/1998 | Read et al. ............ 219/121.48 |
| 5,954,882 A | * 9/1999 | Wild et al. .......... 118/723 MW |
| 5,965,786 A | 10/1999 | Rostaing et al. ............ 588/210 |
| 5,973,289 A | 10/1999 | Read et al. ............ 219/121.48 |
| 5,993,612 A | 11/1999 | Rostaing et al. ......... 204/158.2 |

FOREIGN PATENT DOCUMENTS

FR    2591412 A1    12/1985

OTHER PUBLICATIONS

Jin et al., "A microwave plasma torch assembly for atomic emission spectromety," Spectrochimica Acta, vol. 46B, No. 3, pp. 417–430, 1991.

Moisan et al., "The Electromagnetic Performance of a Surfatron Based Coaxial Microwave Plasma Torch," Spectrochimica Acta, vol. 50B, No. 8, pp. 781–789, 1995.

Pack et al., "An Improved Microwave Plasma Torch for Atomic Spectrometry," Spectrochimica Acta, Part B, 52, pp. 2163–2168, 1997.

Bilgic et al., "Design and Modeling of a Modified 2.45 GHz Coaxial Plasma Torch for Atomic Spectrometry," Spectrochimica Acta, Part B, 53, pp. 773–777, 1988.

Kapicka et al., "The High Pressure Plasma Source for the Surface Treatment Technology Based on the Torch Discharge Stabilized by Working Gas Flow," Czechoslovak Journal of Physics, vol. 48, pp. 1161–1166, 1998.

International Search Report for PCT Application PCT/US01/17266, date of mailing Jan. 16, 2002.

* cited by examiner

*Primary Examiner*—Mark Paschall
(74) *Attorney, Agent, or Firm*—Larry Williams

(57) ABSTRACT

Plasma processing is carried out at pressures of about atmospheric pressure, at pressures below atmospheric pressure, or at pressures above atmospheric pressure. The plasmas are generated using a RF power source and a rectangular waveguide. The plasmas can be used for applications such as materials processing and carrying out chemical reactions.

28 Claims, 11 Drawing Sheets

METHODS AND APPARATUS FOR PLASMA PROCESSING

CROSS-REFERENCE TO RELATED APPLICATIONS

The present application claims priority from U.S. patent application Ser. No. 60/208,009, entitled METHODS AND APPARATUS FOR PLASMA PROCESSING, filed May 25, 2000, the contents of U.S. patent application Ser. No. 60/208,009 are incorporated herein by reference.

TECHNICAL FIELD

This invention relates to improved methods and apparatus for radio frequency (RF) power plasma processing at pressures ranging from about sub-atmospheric pressure to greater than atmospheric pressure.

BACKGROUND

RF plasma is extensively used in a wide variety of applications for carrying out process operations. The manufacture of semiconductor devices is one area in which plasmas are extensively used. During the manufacture of semiconductor devices, etch processes involving RF plasmas and deposition processes involving RF plasmas are used repeatedly during the fabrication process. One of the main benefits of using plasma and downstream plasma species is the ability of the plasma to stimulate chemical reactions that would otherwise require temperatures that are too high for use in the fabrication of semiconductor devices.

Plasmas are also used in cleaning processes in manufacture of semiconductor devices. The plasmas are commonly used to strip photoresist materials from semiconductor wafers as part of post etch wafer clean procedures. Resist material is stripped from the surface of the wafers by creating a plasma in a gas containing oxidizing species such as oxygen and possibly halogen species that are capable of reacting with and volatilizing the resist material. In some applications, the plasma is maintained at a position upstream of the wafer. Reactive species generated in the plasma flow downstream and react with the wafer surface for the stripping process. Another cleaning process that uses plasmas is the cleaning of reaction chambers used in semiconductor manufacturing.

RF plasmas have also been used for decomposition of chemical compounds that are hazardous or otherwise undesirable. Some of the compounds are highly refractory in nature and are difficult to decompose. Examples of compounds that have been decomposed or abated with plasmas include chlorofluorocarbons (CFC) and perfluorocompounds (PFC).

Clearly, there are numerous applications requiring reliable and efficient methods and apparatus for igniting and sustaining RF plasmas. Unfortunately, typical methods and apparatus for old-style RF plasma systems have characteristics that are undesirable for some applications. There is a need for methods and apparatus for generating RF plasmas that are simple, economical, and capable of operating at atmospheric and sub atmospheric pressures.

SUMMARY

This invention seeks to provide methods and apparatus that can overcome deficiencies in known plasma technology. One aspect of the present invention includes methods and apparatus for generating plasmas at pressures ranging from less than one atmosphere to greater than one atmosphere. Another aspect of the present invention includes methods for plasma processing. Still another aspect of the present invention includes apparatus for plasma processing.

One embodiment is a method of generating a plasma; the method being carried out using a microwave power source and a rectangular waveguide, the waveguide having an open end capable of receiving microwaves and a closed end, the open end of the waveguide being connected with the microwave power source so as to be capable of receiving microwave power, the microwave power source being capable of providing microwaves at a wavelength lambda, the waveguide having a gas entry port for flowing a gas into the waveguide, the waveguide having a gas exit port for the gas to exit the waveguide, the gas exit port being located at a distance approximately an odd number of quarter wavelengths lambda from the closed end of the waveguide so that the direction of the electric field lines is substantially parallel to or at an angled to the direction of the exit gas flow, the method comprising the steps of: providing a gas flow through the waveguide so that the gas exits through the gas exit port; providing microwave power to the waveguide so as to create an electric field in the waveguide at the location of the gas exit port; extending an electrically conducting member into the waveguide near the gas exit port so as to facilitate igniting the plasma, wherein the conducting member is connected with an electrical ground, and coupling sufficient microwave power to the gas to sustain the plasma.

It is to be understood that the invention is not limited in its application to the details of construction and to the arrangements of the components set forth in the following description or illustrated in the drawings. The invention is capable of other embodiments and of being practiced and carried out in various ways. In addition, it is to be understood that the phraseology and terminology employed herein are for the purpose of description and should not be regarded as limiting.

As such, those skilled in the art will appreciate that the conception, upon which this disclosure is based, may readily be utilized as a basis for the designing of other structures, methods and systems for carrying out aspects of the present invention. It is important, therefore, that the claims be regarded as including such equivalent constructions insofar as they do not depart from the spirit and scope of the present invention.

The above and still further features and advantages of the present invention will become apparent upon consideration of the following detailed descriptions of specific embodiments thereof, especially when taken in conjunction with the accompanying drawings.

DESCRIPTION

Figure 1A:
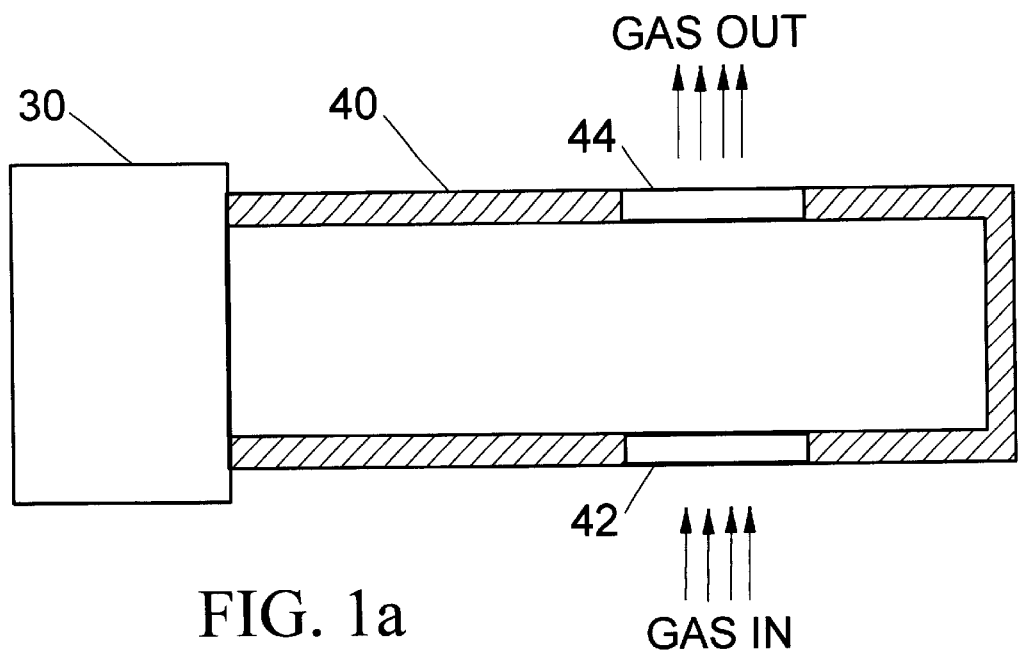
FIG. 1a is a diagram of a first embodiment of the present invention.

The principles of microwave power transfer for waveguides is well known. Discussions of microwave principles can be found in references such as Thomas S. Laverghetta, "Practical Microwaves," Prentice-Hall, N.J., 1996, Stephen C. Harsany, "Principles of Microwave Technology," Prentice-Hall, N.J., 1997, and John A. Seeger, "Microwave Theory Components and Devices," Prentice-Hall, N.J., 1986. All these references are incorporated herein by this reference.

According to microwave transmission principles, a rectangular waveguide having a cross-sectional width "a" and a cross-sectional thickness "b", where "a">"b", $TE_{10}$ mode (or a $TE_{10}$ equivalent mode) produces the largest electric field variation across the thickness of the waveguide. Embodiments of the present invention take advantage of this characteristic of microwave power transmission to produce a plasma using a waveguide without the need for a resonant cavity.

In the following description of the figures, identical reference numerals have been used when designating substantially identical elements or steps that are common to the figures.

Reference is now made to FIG. 1a wherein there is shown an embodiment of the present invention for generating a plasma in a gas using microwave power. The apparatus includes a microwave power source 30 capable of providing microwave power having a wavelength lambda. The apparatus further includes a rectangular waveguide 40, shown in cross-section in FIG. 1a. Waveguide 40 has an open end and a closed end. The closed end comprises a conductive material so as to contain the microwaves. The open end of waveguide 40 is connected with microwave power source 30 so as to be capable of receiving microwave power from power source 30. Waveguide 40 has a gas entry port 42 for receiving gas and a gas exit port 44 for releasing gas. For the embodiment shown in FIG. 1a, gas entry port 42 and gas exit port 44 are located a distance equal to about an odd number of ¼ lambda from the closed end of waveguide 40. In a preferred embodiment, the distance is about ¼ lambda.

The dimensions of waveguide 40 are selected so that for microwave power having wavelength lambda, waveguide 40 supports a mode equivalent to a $TE_{10}$ mode. Preferably, the dimensions are selected so that waveguide 40 supports the $TE_{10}$ mode. When supporting the $TE_{10}$ mode, the maximum variation in electric field through the thickness of waveguide 40 occurs at locations that are an odd number of ¼ lambda from the closed end of waveguide 40. Consequently, establishing a net gas flow such as a gas flow between gas entry port 42 and gas exit port 44 produces a net gas flow direction that is substantially parallel to or at an angle to the direction of the electric field at an odd number of ¼ lambda distance from the closed end of waveguide 40. Furthermore, application of a sufficient amount of microwave power generates a plasma in the flowing gas.

Figure 1B:
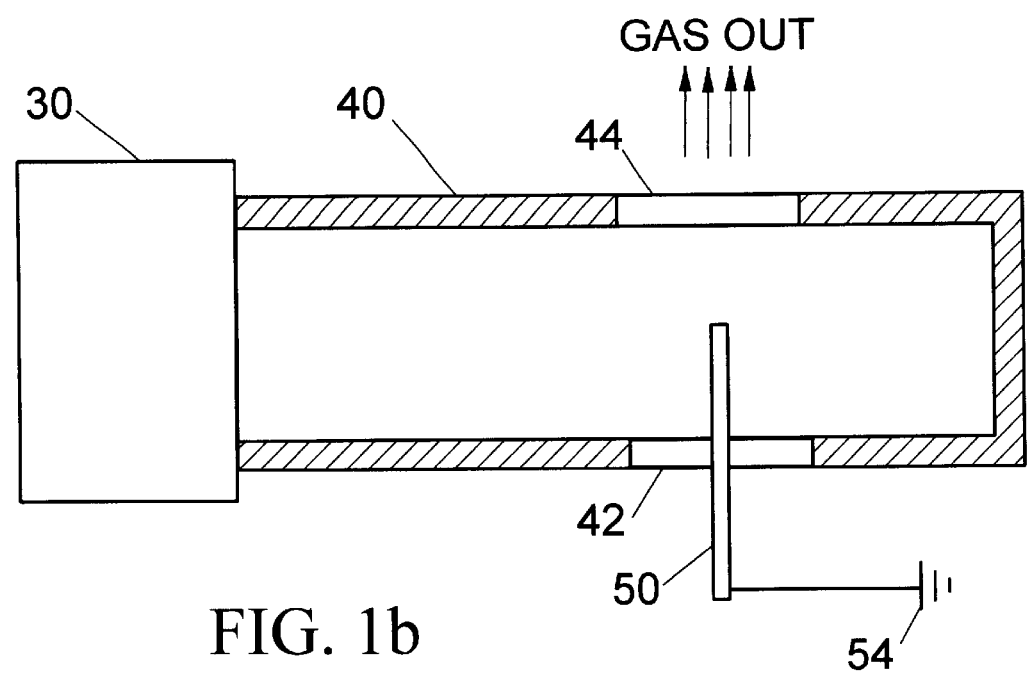
FIG. 1b is a diagram of a second embodiment of the present invention.

Reference is now made to FIG. 1b wherein there is shown the embodiment presented for FIG. 1a with the addition of an electrically conducting member 50. Member 50 is electrically conductive so as to be able to absorb microwaves. Member 50 extends into waveguide 40 at a position near gas exit port 44. In other words, member 50 is located at about an odd number of ¼ lambda distance from the closed end of waveguide 40, i.e. a distance that corresponds to the desired gas flow path. Specifically, FIG. 1b shows member 50 extending into waveguide 40 through gas entry port 42. For the embodiment shown in FIG. 1b, member 50 is electrically grounded with electrical ground connection 54. In some embodiments, member 50 helps to stabilize the plasma and facilitates igniting the plasma.

There are numerous embodiments for member 50. Member 50 may include conductive metals and metal alloys such as, for examples, aluminum, gold, copper, brass, steel, platinum, titanium, tantalum, and tungsten. Member 50 may comprise a metal rod or it may comprise a metal tube.

Figure 1C:
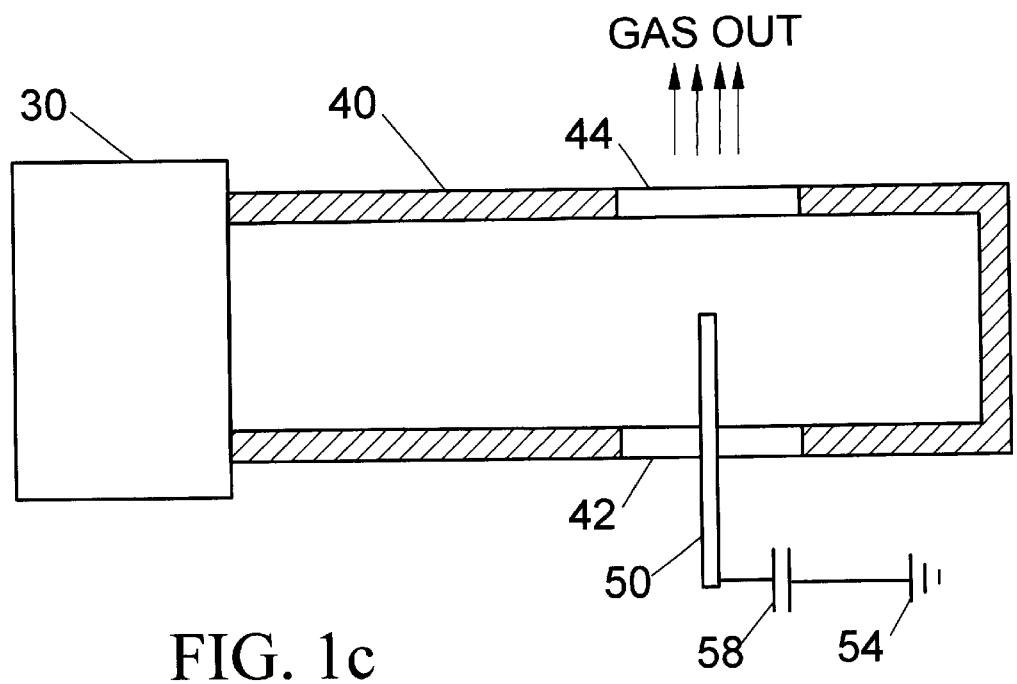
FIG. 1c is a diagram of a third embodiment of the present invention.

Reference is now made to FIG. 1c wherein there is shown the embodiment presented in FIG. 1b with the addition of a capacitor 58. Capacitor 58 is electrically connected between member 50 and ground connection 54. Capacitor 58 electrically decouples member 50. The capacitance for capacitor 58 will depend upon the hardware configuration and the applications selected for the hardware. For one embodiment, examples of suitable capacitance values range from about 20 to 300 pf, including all values and subranges subsumed therein, with a preferred range from about 40 pf to 80 pf, including all values subsumed therein.

Figure 1D:
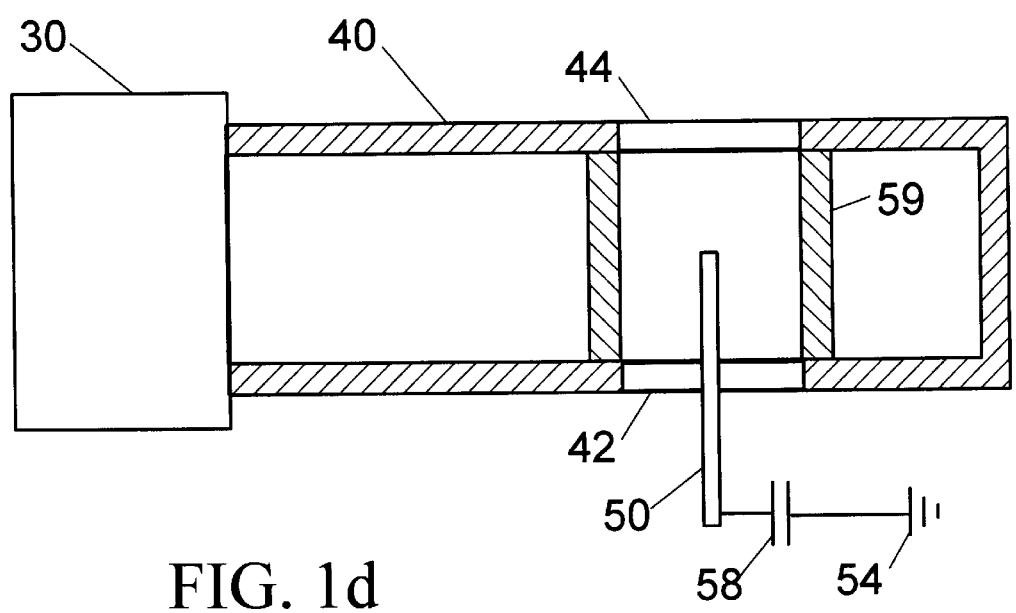
FIG. 1d is a diagram of a fourth embodiment of the present invention.

Reference is now made to FIG. 1d wherein there is shown the embodiment presented in FIG. 1c with the addition of a conduit 59 for confining the gas flow through waveguide 40 to the region near gas entry port 42 and gas exit port 44. For the embodiment shown in FIG. 1d, conduit 59 is contained in waveguide 40. One purpose of conduit 59 is to prevent unnecessary exposure of the interior of waveguide 40 to the gas flowing in waveguide 40. Conduit 59 is made of a material that is substantially transparent to microwaves; examples of suitable materials include polymers, ceramics, and quartz. In an alternative embodiment, a section of waveguide 40 may be isolated from the gas flow using a section of microwave window. It should be understood that conduit 59 is not necessary for the function of embodiments of the present invention.

Figure 1E:
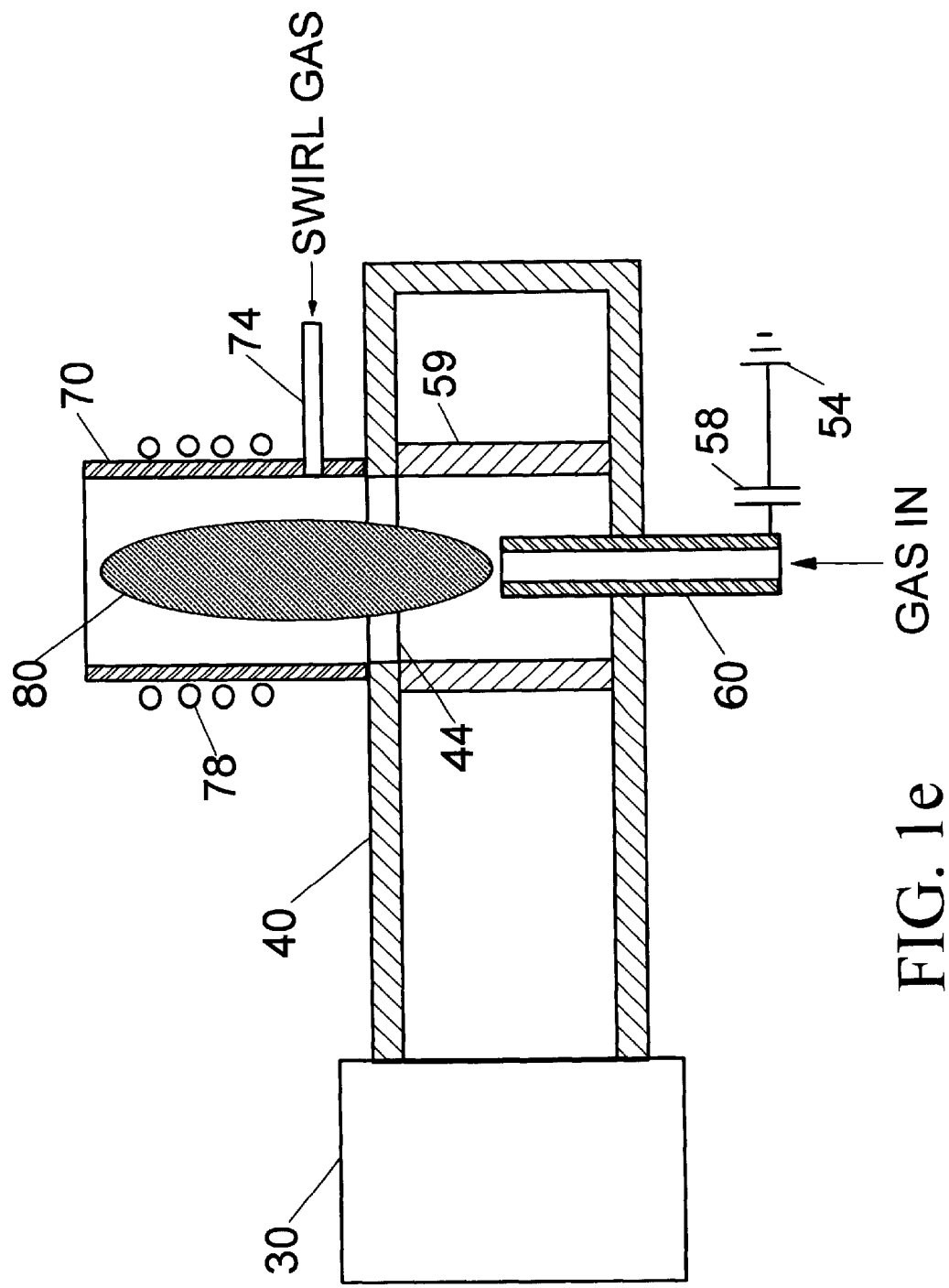
FIG. 1e is a diagram of a fifth embodiment of the present invention.

Reference is now made to FIG. 1e wherein there is shown another embodiment of the present invention. The apparatus includes a microwave power source 30 capable of providing microwave power having a wavelength lambda. The apparatus further includes a rectangular waveguide 40. Waveguide 40 has an open end and a closed end. The closed end comprises a conductive material so as to contain the microwaves. The open end of waveguide 40 is connected with microwave power source 30 so as to be capable of receiving microwave power from power source 30. Waveguide 40 has a gas exit port 44 for releasing gas. The apparatus further includes a gas injector 60 for providing gas to waveguide 40. For the embodiment shown in FIG. 1e, gas injector 60 and gas exit port 44 are located a distance equal to about an odd number of ¼ lambda from the closed end of waveguide 40. In a preferred embodiment, the distance is about ¼ lambda.

The reasons for selecting the locations for gas injector 60 and gas exit port 44 are substantially the same reasons presented for the selection of the locations for gas entry port 42 and gas exit port 44 for the embodiment presented in FIG. 1a.

The dimensions of waveguide 40 in FIG. 1e are substantially the same as the dimensions of waveguide in FIG. 1a. Furthermore, conduit 59 in FIG. 1e has substantially the same characteristics as conduit 59 in FIG. 1d.

Gas injector 60 is electrically conductive so as to be able to absorb microwaves. Gas injector 60 extends into waveguide 40 at a position near gas exit port 44. In other words, injector 60 is located at about an odd number of ¼ lambda distance from the closed end of waveguide 40 so as to correspond to the desired gas flow path. In addition to being capable of providing a gas flow into waveguide 40, gas injector 60 also performs substantially the same function as electrically conducting member 50 described in the embodiments in FIG. 1b, FIG. 1c, and FIG. 1d. It is to be understood that the grounding options for gas injector 60 are substantially the same as those presented for conducting member 50 even though FIG. 1e only shows grounding of injector 60 through capacitor 58 and ground connection 54.

The apparatus further includes a housing 70 connected with waveguide 40. Housing 70 has a hole arranged so as to receive gas and plasma products from waveguide 40 through gas exit port 44. Housing 70 has a port for exhausting the gas. Optionally, cooling coils 78 may be connected with housing 70 for controlling the temperature of housing 70 during operation of the apparatus. Preferably, housing 70 is electrically conductive and electrically grounded. In other words, housing 70 preferably comprises a metal or metal alloy such as copper, aluminum, steel, and brass. Housing 70 further includes a connection 74 for generating a swirl gas flow in housing 70. Connection 74 comprises a gas inlet connected with housing 70 at a tangential angle so that gas entering housing 70 through connection 74 creates a swirl gas flow along the interior wall of housing 70. In a preferred embodiment, housing 70 has a cylindrical shape so as to further support the swirl gas flow. FIG. 1e indicates the presence of a plasma 80 positioned above injector 60 and extending into housing 70.

Figure 1F:
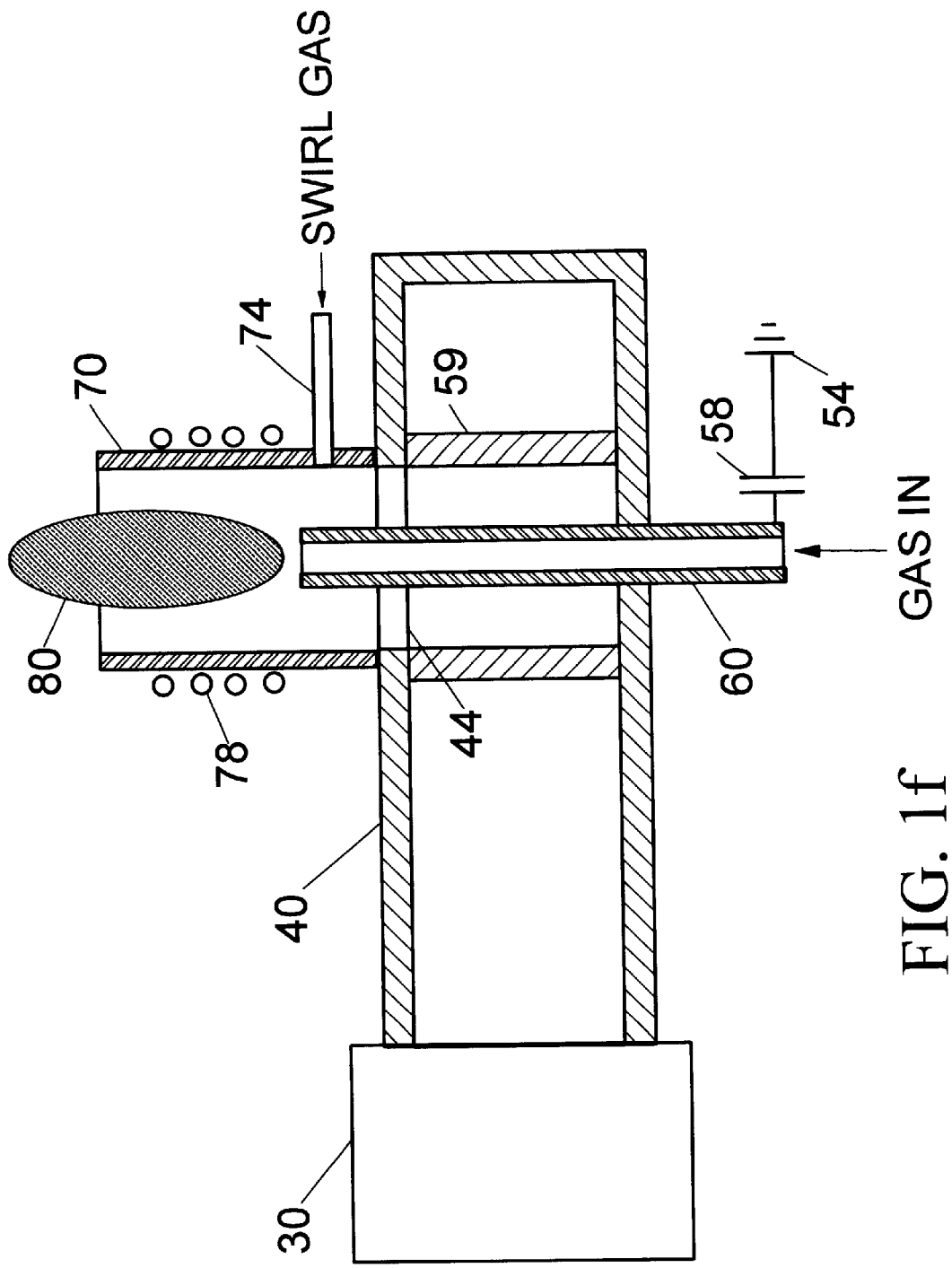
FIG. 1f is a diagram of a sixth embodiment of the present invention.

Referring now to FIG. 1f wherein there is shown an embodiment of the present invention substantially the same as that shown in FIG. 1e. However, the embodiment shown in FIG. 1f has gas injector 60 extending through waveguide 40 into housing 70.

Figure 1G:
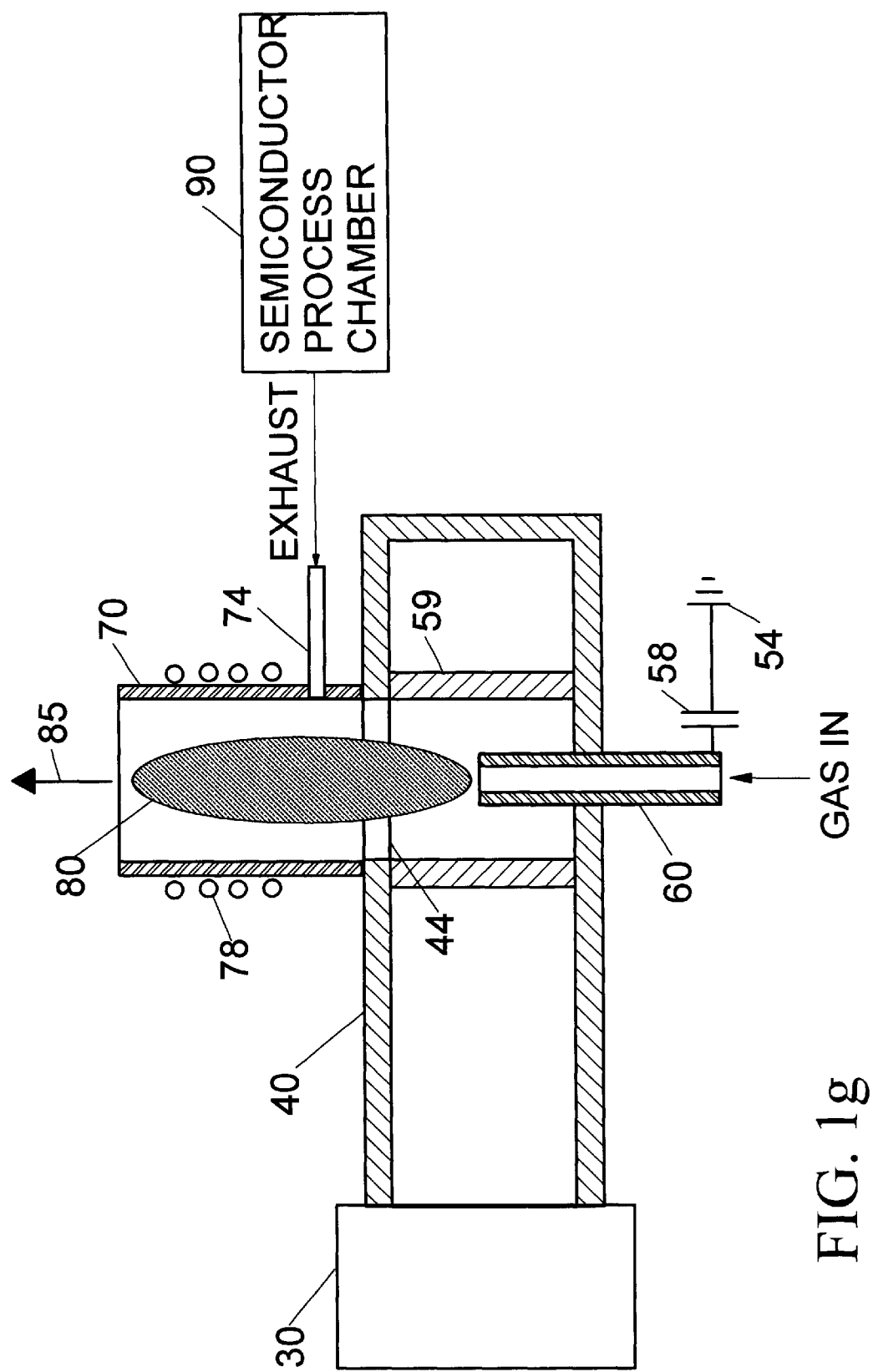
FIG. 1g is a diagram of a seventh embodiment of the present invention.

Referring now to FIG. 1g wherein there is shown the apparatus presented in FIG. 1f and a semiconductor process chamber 90. Semiconductor process chamber 90 is connected with the apparatus FIG. 1f so that exhaust gases emanating from semiconductor process chamber 90 can be provided as a component of the swirl gas provided to connection 74. Providing the exhaust gases from semiconductor process chamber 90 to housing 70 allows plasma 80 to abate undesirable compounds that may be present in the semiconductor exhaust. For example, semiconductor process chamber 90 may be a chamber such as an etching chamber or a deposition chamber that uses perfluorocompounds that need to be abated. Optionally, the gas from gas injector 60 may include an ancillary abatement gas to facilitate abatement of the undesirable components in the exhaust from semiconductor process chamber 90. Gas and plasma products 85 leave housing 70 and may be further treated with liquid or solid scrubbing systems (not shown in FIG. 1g) and/or particulate filters (not shown in FIG. 1g). The liquid or solid scrubbing systems may include chemical compounds or solutions that absorb acid gases or other gases that may result from abatement of halogen-containing organic compounds, perfluorocompounds, and other refractory compounds.

Figure 1H:
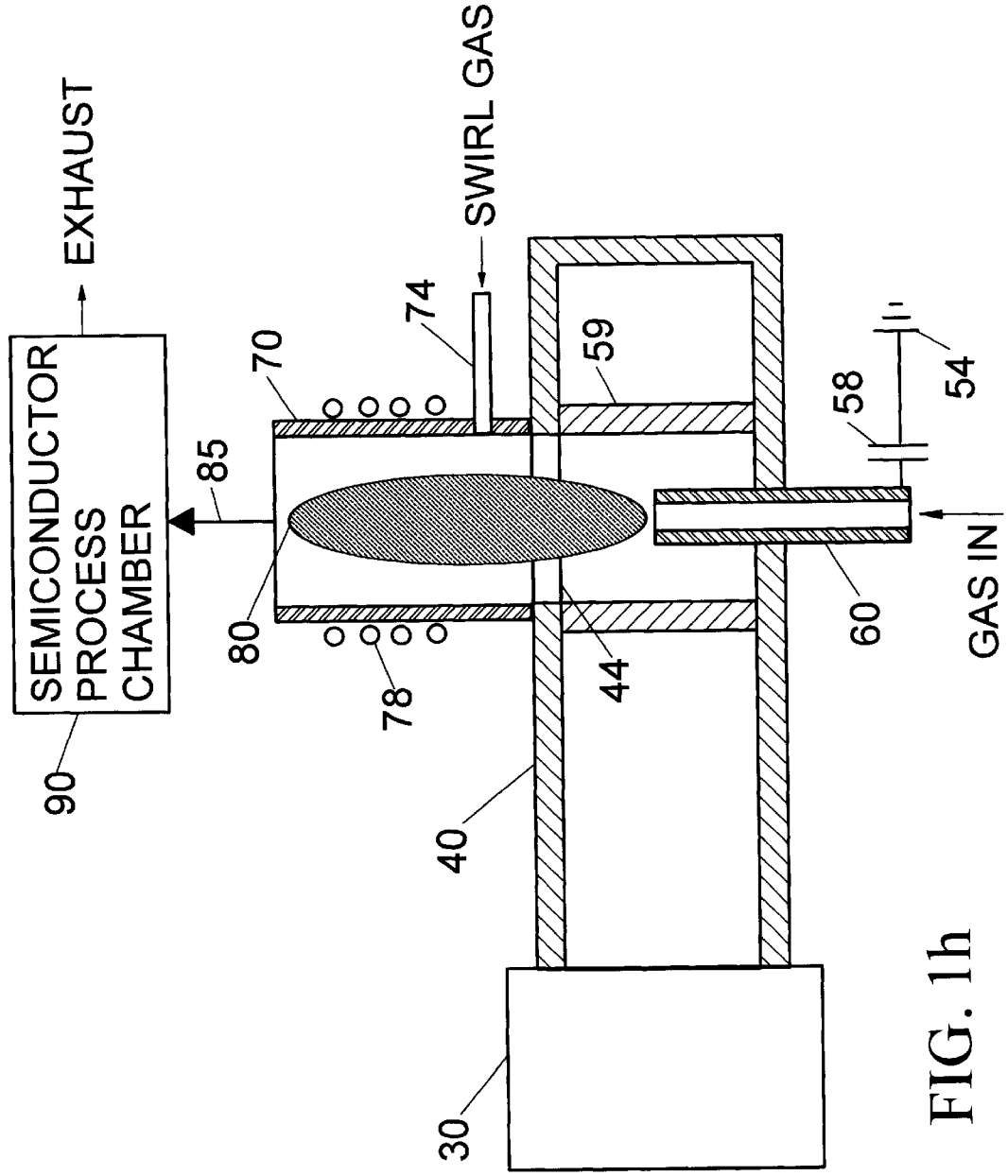
FIG. 1h is a diagram of an eighth embodiment of the present invention.

Referring now to FIG. 1h wherein there is shown the apparatus presented in FIG. 1f and a semiconductor process chamber 90. Semiconductor process chamber 90 is connected with the apparatus FIG. 1f so that gases and plasma products 85 from housing 70 can enter semiconductor process chamber 90 as feed gases for processes taking place in semiconductor process chamber 90. Optionally, the swirl gas fed through connection 74 and the gas from injector 60 may include chemical species required for the processes to be performed in chamber 90.

For example, chamber 90 may be a chamber such as an etching chamber or a deposition chamber that uses gases and plasma products 85 such as those that can be produced by plasma 80. Exhaust gas leaving chamber 90 may be further treated with liquid, solid, or plasma scrubbing systems (not shown in FIG. 1h) and/or particulate filters (not shown in FIG. 1h).

Figure 2A:
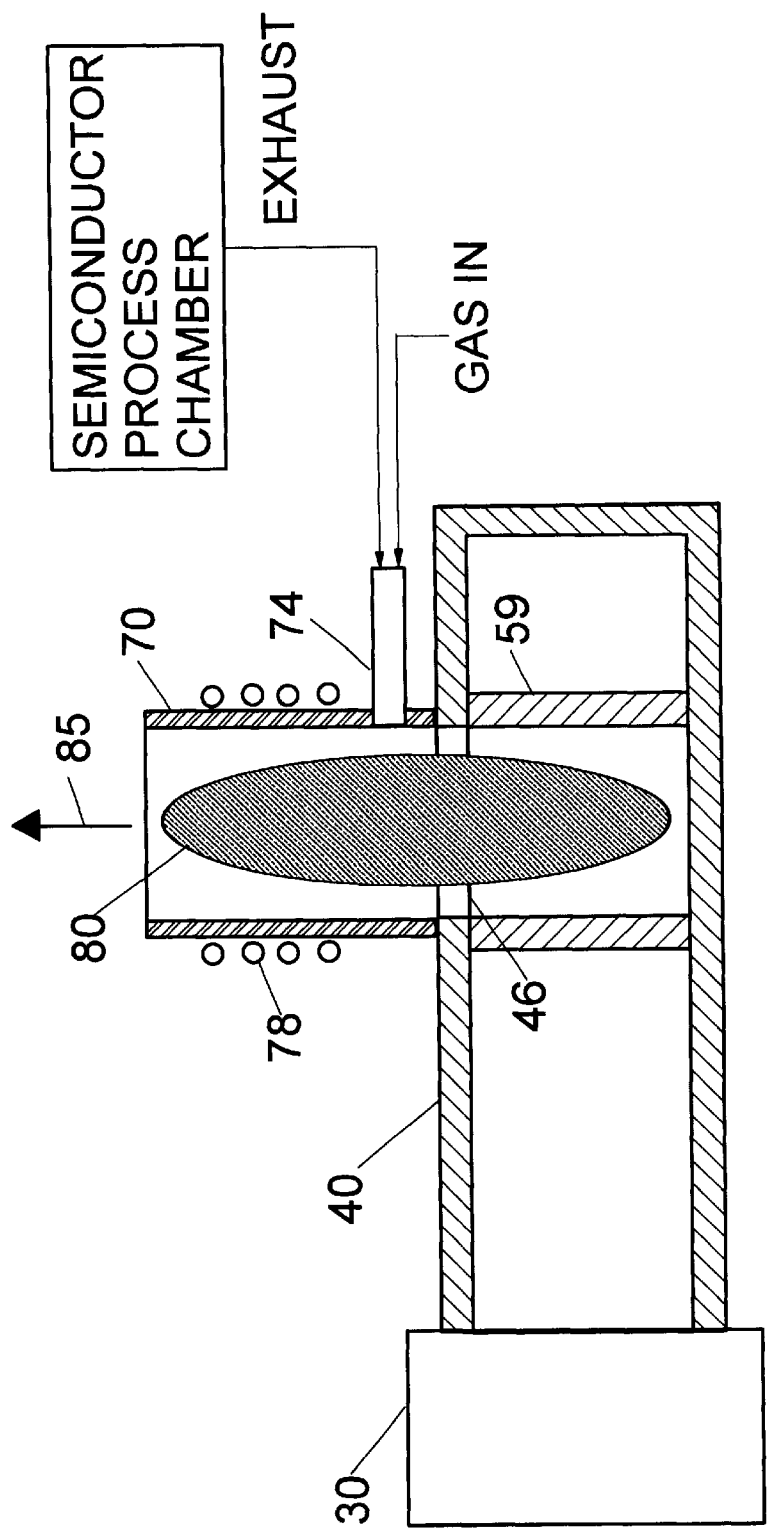
FIG. 2a is a diagram of a ninth embodiment of the present invention.

Referring now to FIG. 2a wherein there is shown an embodiment similar to the embodiment presented in FIG. 1g. The embodiment shown in FIG. 2a does not substantially provide for a gas flow through waveguide 40. Waveguide 40 has a hole 46 so that plasma 80 can extend from the interior of waveguide 40 into housing 70. The apparatus is configured so that the gas, including the swirl gas and any additional gas can be applied to housing 70 via connection 74 so that the gas fed to housing 70 creates a swirl gas flow inside of housing 70. Unlike the embodiment presented in FIG. 1g, the embodiment presented in FIG. 2a does not have a separate port for feeding through waveguide 40. The additional gas that may be applied to connection 74 may include an ancillary abatement gas to facilitate the abatement of undesirable species in the exhaust from the semiconductor process chamber.

Figure 2B:
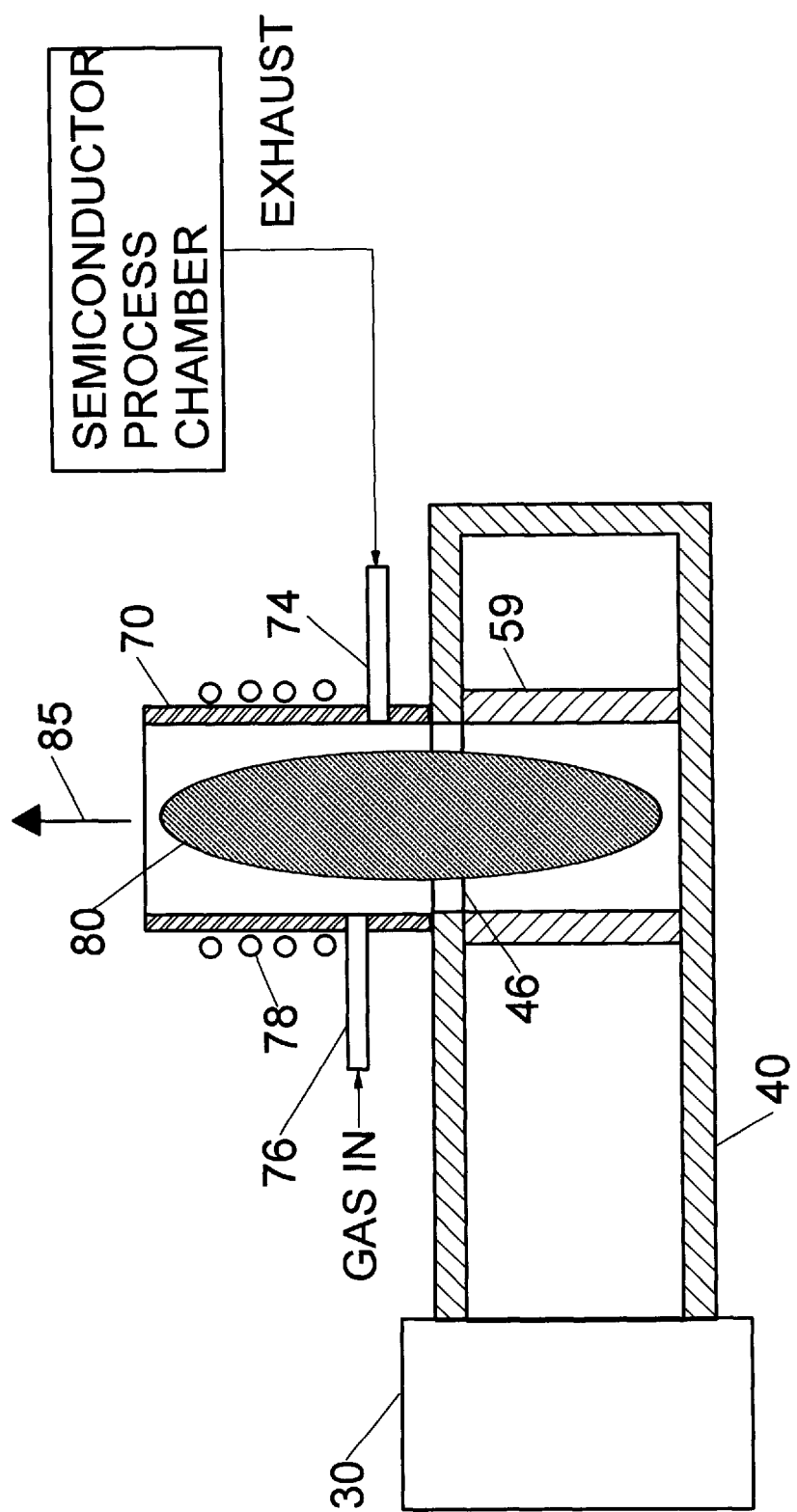
FIG. 2b is a diagram of a tenth embodiment of the present invention.

Referring now to FIG. 2b wherein there is shown an embodiment similar to the embodiment presented in FIG. 2a. The embodiment shown in FIG. 2b is substantially the same as the embodiment presented in FIG. 2a except that a gas connection 76 is connected with housing 70 to provide another gas input to housing 70. Exhaust gases from the semiconductor process chamber are still provided to connection 74 to generate the swirl gas flow. Optionally, ancillary abatement gases or other gases may be applied to housing 70 via connection 76.

Figure 2C:
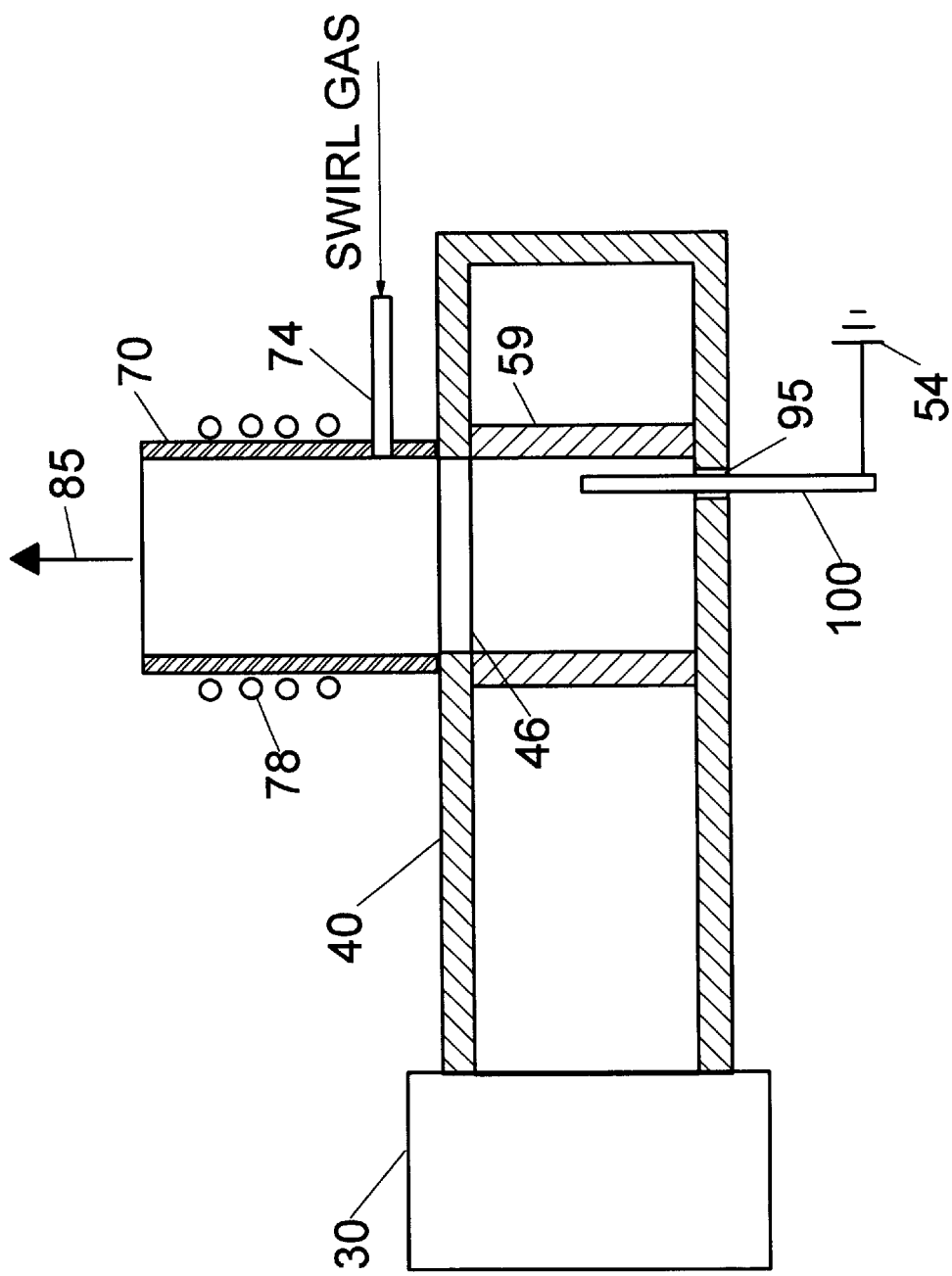
FIG. 2c is a diagram of an eleventh embodiment of the present invention.
Figure 2D:
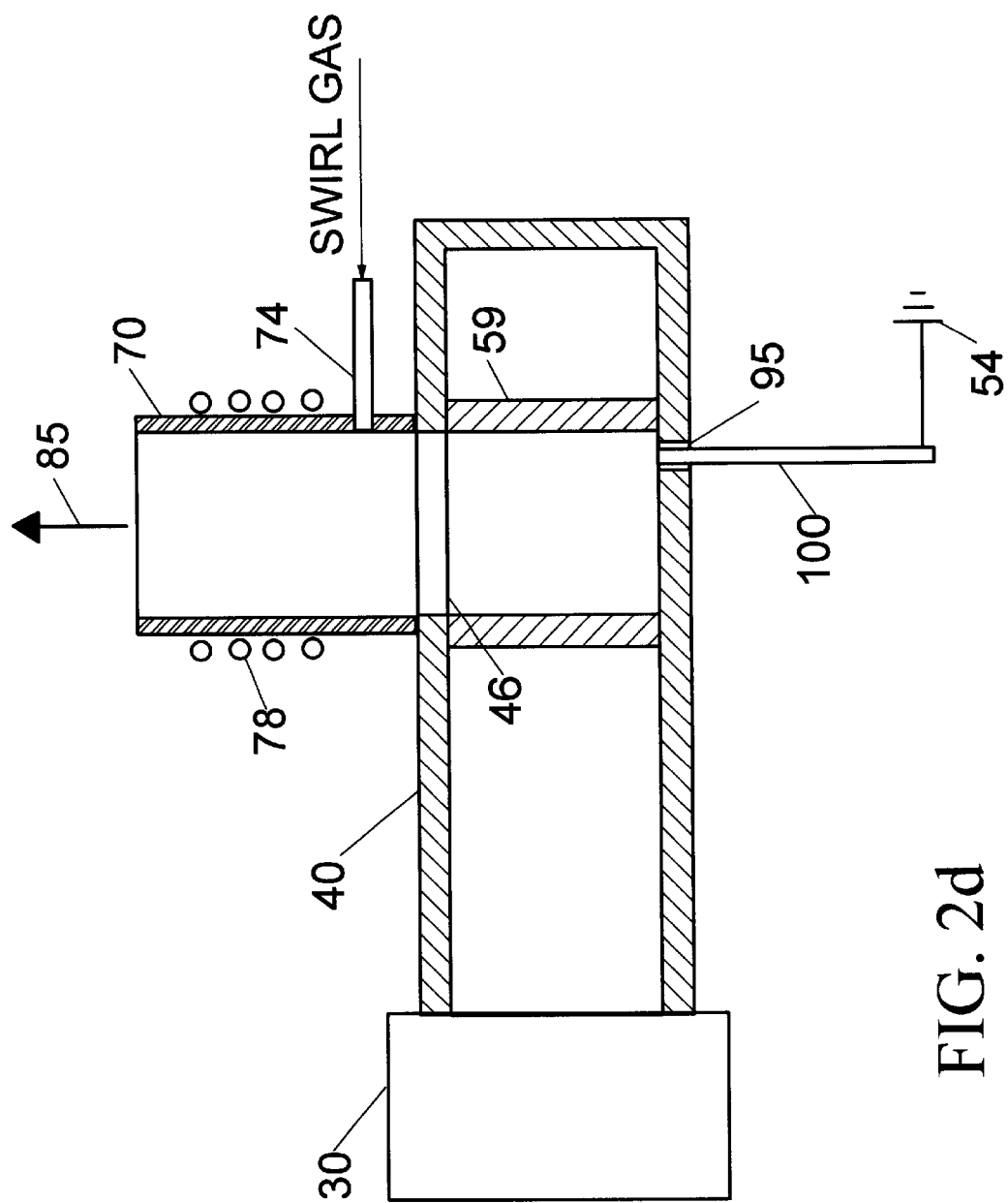
FIG. 2d is a diagram of a twelfth embodiment of the present invention.

Referring now to FIG. 2c wherein there is shown an apparatus similar to that presented in FIG. 2a. The embodiment shown in FIG. 2c shows waveguide 40 having a hole 95. The embodiment shown in FIG. 2c further includes an igniter 100 for aiding plasma ignition. The igniter 100 is an electrically conducting member movably connected with waveguide 40 through hole 95 so that igniter 100 is capable of movement to a first positioned at which igniter 100 extends into the interior of waveguide 40, as shown in FIG. 2c. Preferably, igniter 100 is electrically grounded as shown in FIG. 2c through connection with electrical ground connection 54. Furthermore, igniter 100 is capable of movement to a second position at which igniter 100 does not substantially extend into the interior of waveguide 40 as is shown in FIG. 2d.

Hole 95 and igniter 100 are positioned in the waveguide near the location for the plasma. More specifically, hole 95 and igniter 100 are positioned near port 46. In some embodiments, igniter 100 is positioned within a distance of about ⅛ lambda from about the center of port 46.

In a preferred embodiment, igniter 100 is extended into waveguide 40 when needed to facilitate plasma ignition; after ignition of the plasma, igniter 100 is substantially removed from the interior of waveguide 40. Movement of igniter 100 may be affected using a mechanical device such as a worm gear, pneumatic actuator, or solenoid actuator. Suitable linear actuators that can be used for moving igniter 100 are well known and they are commercially available.

Igniter 100 may include electrically conductive metals and alloys. Some examples of suitable metals and alloys for igniter 100 are aluminum, gold, copper, brass, steel, platinum, titanium, tantalum, and tungsten.

Figure 2E:
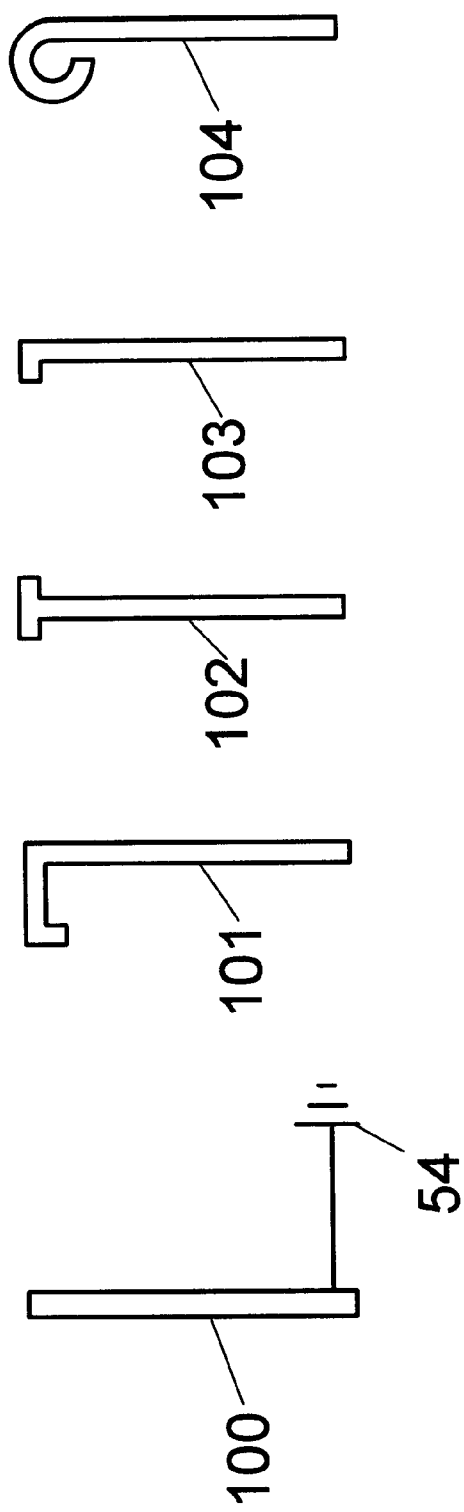
FIG. 2e is a diagram of igniter configurations.

Referring now to FIG. 2e wherein there are shown igniter 100 in a generic configuration and igniters 101, 102, 103, and 104 showing examples of specific configurations that have been tested and shown to be capable of facilitating plasma ignition. It is believed that there are numerous suitable configurations. Testing completed to date indicate that igniters having shapes that include a bend, or a turn, or a section at an angle to another section can provide superior results in igniting the plasma.

Although the examples presented herein involve using microwave power, such as microwave power at frequencies of about 2.45 GHz, it is to be understood that other RF frequencies can be included in embodiments of the present invention. More specifically, suitable frequencies for embodiments of the present invention include the full microwave spectrum as well frequencies above and below the microwave spectrum.

Embodiments of the present invention can be used to produce microwave plasmas at about atmospheric pressure. Alternatively, embodiments of the present invention can be applied to plasmas operating at pressures other than approximately atmospheric pressure, such as at sub-atmospheric pressure or at pressures greater than atmospheric pressure. Plasmas operating at sub-atmospheric pressure, preferably, may be enclosed in a vacuum chamber.

Another embodiment of the present invention includes methods and apparatus for abatement of gaseous compounds. Some examples of the gaseous compounds the can be abated include halogenated organic compounds, other refractory organic compounds, perfluorocompounds, and refractory inorganic compounds. In a further embodiment of the present invention, the treatment of gases is enhanced by the addition of suitable ancillary reaction gases including water, methane, hydrogen, ammonia, hydrogen peroxide, oxygen, or mixtures thereof.

Embodiments of the present invention provide methods and apparatus for generating plasmas for semiconductor device fabrication steps such as etching, deposition, cleaning, doping, oxidation, drying, photoresist stripping, parts cleaning, reaction chamber cleaning, and annealing. In one embodiment, the plasma generation and the semiconductor device fabrication step occur in the same chamber. In an alternative embodiment, the plasma generation occurs at the plasma location and reactive species from the plasma are transported to another chamber for the semiconductor device fabrication step. In one embodiment, the plasma chamber is connected with a semiconductor process tool so that the process tool receives reactive species from the plasma.

Embodiments of the present invention provide methods and apparatus for removal of refractory compounds from waste streams. Refractory compounds include compounds that show a high degree of stability with respect to temperature and reactivity and are difficult to decompose.

Embodiments of the present invention provide new and useful methods and apparatus for the destruction of refractory compounds such as perfluorocompounds, such as carbon fluorides, carbon tetrafluoride, nitrogen trifluoride, and sulfur hexafluoride by reactions facilitated by a plasma.

Embodiments of the present invention provide methods and apparatus that are suitable for processing waste streams emanating from one or more individual semiconductor process tools and the apparatus can become an integral part of the semiconductor device fabrication process. In one embodiment, the apparatus is connected with semiconductor process tools such as chemical vapor deposition tools, plasma etching tools, plasma cleaning tools, doping tools, photoresist stripping tools, and plasma deposition tools.

As one example, exhaust gases from the semiconductor process tools may be included in the swirl gas flow so that the exhaust gases can be abated by the plasma. In addition, an ancillary abatement gas may be included with the gas flowing through the waveguide that sustains the plasma. The ancillary abatement gas can help to facilitate abatement of undesirable species from the semiconductor process tools.

As another example, exhaust gases from the semiconductor process tools may be mixed with the plasma from an additional gas stream. As a third example, exhaust gases from the process tools may be applied to the plasma through the gas injector.

Embodiments of the present invention can also be used for applications such as synthesis of chemical compounds that are difficult to produce other than by using plasma processes.

An important advantage of embodiments of the present invention is the capability of generating plasmas at about atmospheric pressure. The capability of producing plasmas at atmospheric pressure alleviates the need for expensive vacuum chambers and vacuum pumping systems. Furthermore, plasma processing at about atmospheric pressure may reduce the net energy consumption of the process because energy does not have to be expended in maintaining vacuum conditions.

While there have been described and illustrated specific embodiments of the invention, it will be clear that variations in the details of the embodiments specifically illustrated and described may be made without departing from the true spirit and scope of the invention as defined in the appended claims and their legal equivalents.

What is claimed is:

1. A method of generating a plasma, the method being carried out using a microwave power source and a rectangular waveguide, the waveguide having an open end capable of receiving microwaves and a closed end, the open end of the waveguide being connected with the microwave power source so as to be capable of receiving microwave power, the microwave power source being capable of providing microwaves at a wavelength lambda, the waveguide having a gas entry port for flowing a gas into the waveguide, the waveguide having a gas exit port for the gas to exit the waveguide, the gas exit port being located at a distance approximately an odd number of quarter wavelengths lambda from the closed end of the waveguide so that the direction of the electric field lines is substantially parallel to or at an angled to the direction of the exit gas flow, the method comprising the steps of:

a. providing a gas flow through the waveguide so that the gas exits through the gas exit port;
   b. providing microwave power to the waveguide so as to create an electric field in the waveguide at the location of the gas exit port;
   c. extending an electrically conducting member into the waveguide near the gas exit port so as to facilitate igniting the plasma, wherein the conducting member is connected with an electrical ground; and d. coupling sufficient microwave power to the gas to sustain the plasma.

2. The method of claim 1 wherein the gas entry port faces the gas exit port.

3. The method of claim 2 wherein the center of the gas entry port and the center of the gas exit port are about ¼ lambda from the closed end of the waveguide.

4. The method of claim 1 wherein lambda and the dimensions of the rectangular waveguide support at least one of $TE_{10}$ mode and modes equivalent to $TE_{10}$ modes.

5. The method of claim 1 wherein the exit gas is at least one of about atmospheric pressure and substantially greater than atmospheric pressure.

6. The method of claim 1 wherein the electrically conducting member is connected with the electrical ground through a capacitor.

7. The method of claim 1 wherein step a. further comprises confining the gas flow between the gas entry port and the gas exit port within a conduit, the conduit being substantially transparent to microwave power.

8. The method of claim 1 further comprising the step of generating a swirl gas flow so as to stabilize and confine the plasma.

9. The method of claim 8 further comprising the step of providing a swirl gas from exhaust gas generated by a semiconductor wafer processing tool.

10. The method of claim 1 wherein the gas recited in step a. comprises a perfluorocompound.

11. The method of claim 9 wherein the gas recited in step a. comprises an ancillary abatement gas.

12. An apparatus for generating plasma in a gas for plasma processing, the apparatus comprising:

a microwave power source capable of providing microwave power having a wavelength lambda;

a rectangular waveguide having a closed end and an open end, the open end of the waveguide being coupled with the microwave power source for receiving microwave power, the waveguide having a gas exit port for the gas to exit the waveguide, the gas exit port being located approximately an odd number of quarter wavelengths from the closed end of the waveguide;

a gas injector for flowing gas into the waveguide, the gas injector being connected with the waveguide, the gas injector being arranged to extend into the waveguide, the injector being electrically conductive and capable of absorbing rf power, the injector being capable of connection with electrical ground;

wherein the dimensions of the waveguide supports a mode equivalent to the $TE_{10}$ mode upon application of microwave power having wavelength lambda so that the direction of the electric field lines is substantially parallel to or at an angled to the direction of the exit gas flow and application of a sufficient amount of microwave power generates a plasma near the gas exit.

13. The apparatus of claim 12 further comprising a conduit within the waveguide for confining the gas flow through the waveguide, the conduit comprising a material substantially transparent to microwaves.

14. The apparatus of claim 12 further comprising a housing connected with the waveguide, the housing having a hole for receiving exit gas from the waveguide, the housing having a port for exhausting the gas.

15. The apparatus of claim 14 wherein the housing is connected with a gas source so as to create a swirl gas flow into the housing.

16. The apparatus of claim 12 further comprising a capacitor for connecting the gas injector with electrical ground connection.

17. A method of generating a plasma, the method being carried out using a microwave power source, a rectangular waveguide, and a housing, the waveguide having an open end for receiving microwaves and a closed end, the open end of the waveguide being connected with the microwave power source so as to be capable of receiving microwave power, the microwave power source being capable of providing microwaves at a wavelength lambda, wherein lambda and the dimensions of the rectangular waveguide support modes equivalent to $TE_{10}$ modes, the waveguide having a port, the port being located approximately an odd number of quarter wavelengths from the closed end of the waveguide so that the direction of the electric field lines is substantially parallel to or at an angle to the direction of the exit gas flow, the housing being connected with the waveguide, the housing having a hole for allowing fluid communication between the interior of the housing and the interior of the waveguide, the housing having a portal for exhausting the gas the method comprising the steps of:

a. providing a swirl gas flow through the housing;

b. providing microwave power to the waveguide so as to create an electric field in the waveguide at the location of the port in the waveguide;

c. coupling sufficient microwave power to the gas provided to the housing to sustain the plasma.

18. The method of claim 17 wherein the housing has a plurality of gas exit portals.

19. The method of claim 18 wherein the center of the port in the waveguide is about ¼ lambda from the closed end of the waveguide.

20. The method of claim 17 wherein substantially all of the gas for the plasma enters through the housing.

21. The method of claim 17 wherein the plasma is generated at about atmospheric pressure, below atmospheric pressure, or above atmospheric pressure.

22. The method of claim 17 further comprising between step a. and step b. the step of providing an electrically conducting member extending into the waveguide near the port in the waveguide, wherein the conducting member is connected with an electrical ground so as to facilitate igniting the plasma.

23. The method of claim 22 wherein the electrically conducting member is substantially removed from the interior of the waveguide when plasma is present.

24. The method of claim 17 wherein the swirl gas flow includes chemical species to be reacted in the plasma.

25. The method of claim 24 wherein the swirl gas comprises exhaust gas generated by a semiconductor wafer-processing tool.

26. The method of claim 17 wherein the gas recited in step a. comprises a perfluorocompound.

27. The method of claim 25 wherein the gas recited in step a. comprises an ancillary abatement gas.

28. An apparatus for generating plasma in a gas for plasma processing, the apparatus comprising:

a microwave power source capable of providing microwave power having a wavelength lambda;

a rectangular waveguide having a closed end and an open end, the open end of the waveguide being coupled with the microwave power source for receiving microwave power, the waveguide having a port for the plasma and plasma species to pass through, the port being located approximately an odd number of quarter wavelengths from the closed end of the waveguide wherein the dimensions of the waveguide supports a mode equivalent to the $TE_{10}$ mode upon application of microwave power having wavelength lambda;

a conduit within the waveguide for confining the gas flow through the waveguide, the conduit comprising a material substantially transparent to microwaves;

a housing for receiving and sustaining a swirl gas flow, the housing being connected with the waveguide so that the plasma can extend from the interior of the waveguide through the port into the housing, the housing being electrically conductive;

a cooling coil connected with the housing for controlling the temperature of the housing; and an igniter movably connected with the waveguide, the igniter being capable of movement to a first position within the interior of the waveguide to facilitate plasma ignition and capable of movement to a second position substantially out of the interior of the waveguide in the presence of plasma.

* * * * *